US011630162B2

(12) United States Patent
Sato et al.

(10) Patent No.: US 11,630,162 B2
(45) Date of Patent: Apr. 18, 2023

(54) LINE VERIFICATION DEVICE, AND LINE VERIFICATION METHOD

(71) Applicant: Nippon Telegraph and Telephone Corporation, Tokyo (JP)

(72) Inventors: Noriyuki Sato, Tokyo (JP); Takaho Shibata, Tokyo (JP); Tsuyoshi Nagai, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 94 days.

(21) Appl. No.: 17/260,492

(22) PCT Filed: Jul. 5, 2019

(86) PCT No.: PCT/JP2019/026765
§ 371 (c)(1),
(2) Date: Jan. 14, 2021

(87) PCT Pub. No.: WO2020/017352
PCT Pub. Date: Jan. 23, 2020

(65) Prior Publication Data
US 2021/0318390 A1    Oct. 14, 2021

(30) Foreign Application Priority Data

Jul. 18, 2018 (JP) .............................. JP2018-135023

(51) Int. Cl.
*G01R 31/58* (2020.01)
*G01R 17/20* (2006.01)

(52) U.S. Cl.
CPC ............. *G01R 31/58* (2020.01); *G01R 17/20* (2013.01)

(58) Field of Classification Search
CPC ........ G01R 31/50–56; G01R 31/58–60; G01R 17/20
See application file for complete search history.

(56) References Cited

U.S. PATENT DOCUMENTS 2,513,583 A  *  7/1950  Nicholson, Jr. ........ G01R 31/60
                                                    324/66
3,178,639 A  *  4/1965  Hillman ................. G01R 31/58
                                                    324/540
(Continued)

FOREIGN PATENT DOCUMENTS

CN      104584694 A  *  4/2015  ............. G01R 19/10
CN      107861015 A  *  3/2018  ............. G01R 31/60
(Continued)

OTHER PUBLICATIONS

Kako.co.jp, [online], "Wiring continuity checker HWC300 type / HWC200 type," available no later than Jul. 18, 2018, retrieved on May 8, 2018, retrieved from URL<http://www.kako.co.jp/product1/hwc200>, 8 pages (with English Translation).

*Primary Examiner* — Patrick Assouad
*Assistant Examiner* — Demetrius R Pretlow
(74) *Attorney, Agent, or Firm* — Fish & Richardson P.C.

(57) ABSTRACT

Connection normality check of a pair of electric wires is simplified. A circuit check device 1 that checks connection normality of a pair of electric wires L1 and L2 includes, when the pair of electric wires is connected to an exchange 2, a voltmeter 11 that measures a first inter-wire potential difference between one end of an electric wire portion p1 of the electric wire L1 and one end of an electric wire portion p2 of the electric wire L2, a voltmeter 12 that measures a second inter-wire potential difference between the other end of the electric wire portion p1 of the electric wire L1 and the other end of the electric wire portion p2 of the electric wire L2, and a determiner 13 that determines whether the measured first inter-wire potential difference agrees with the measured second inter-wire potential difference.

17 Claims, 8 Drawing Sheets

(56) References Cited

U.S. PATENT DOCUMENTS

| | | | | |
|---|---|---|---|---|
| 3,495,172 | A * | 2/1970 | Davis | G01R 31/58 324/540 |
| 5,488,306 | A * | 1/1996 | Bonaccio | G01R 31/58 324/540 |
| 2009/0273350 | A1 * | 11/2009 | Archer | G01R 31/58 324/522 |
| 2010/0271052 | A1 * | 10/2010 | Ishikawa | H02J 7/0014 324/686 |
| 2013/0278274 | A1 * | 10/2013 | Teggatz | G01R 31/2853 324/539 |
| 2014/0239967 | A1 * | 8/2014 | Towers | H02S 50/10 324/509 |
| 2016/0181799 | A1 * | 6/2016 | Kanemaru | H02M 7/44 307/78 |
| 2016/0320430 | A1 * | 11/2016 | Zhu | G01R 27/14 |
| 2017/0153283 | A1 * | 6/2017 | Gontier | G01R 31/11 |
| 2018/0143234 | A1 * | 5/2018 | Saxby | G01R 15/142 |

FOREIGN PATENT DOCUMENTS

| | | | | |
|---|---|---|---|---|
| EP | 2693227 A2 * | 2/2014 | | G01R 27/16 |
| FR | 2796724 A1 * | 1/2001 | | G01R 31/021 |
| JP | 04097626 A * | 3/1992 | | |
| JP | H0799820 B2 * | 10/1995 | | |
| WO | H0497626 | 3/1992 | | |

* cited by examiner

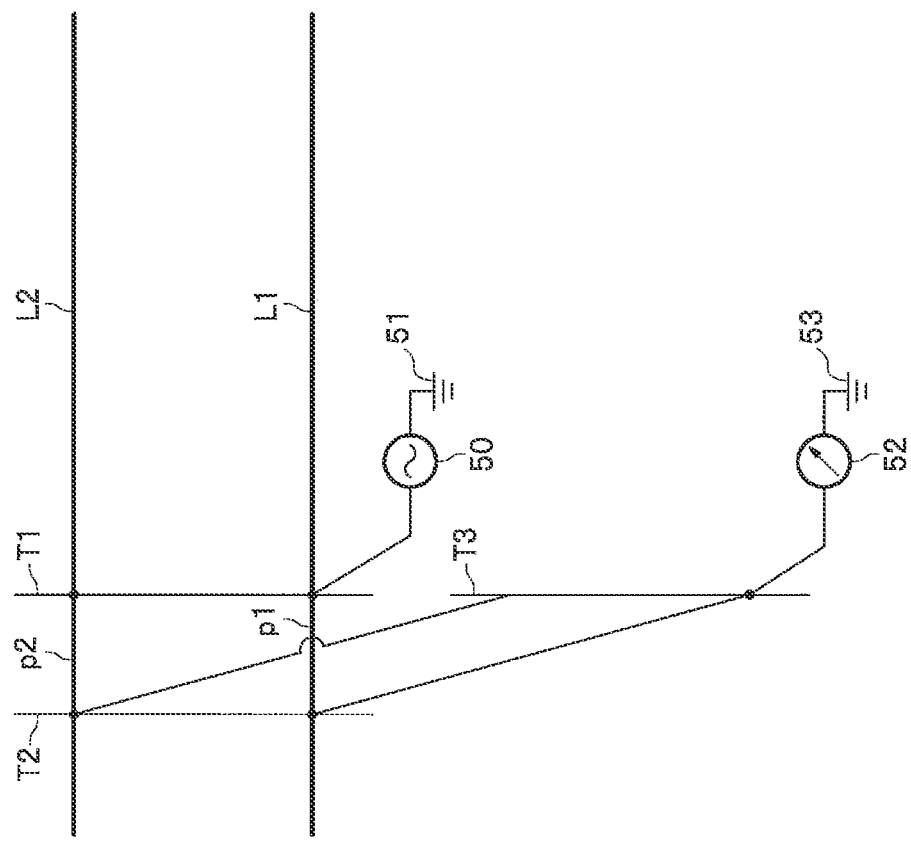

LINE VERIFICATION DEVICE, AND LINE VERIFICATION METHOD

CROSS-REFERENCE TO RELATED APPLICATIONS

This application is a National Stage application under 35 U.S.C. § 371 of International Application No. PCT/JP2019/026765, having an International Filing Date of Jul. 5, 2019, which claims priority to Japanese Application Serial No. 2018-135023, filed on Jul. 18, 2018. The disclosure of the prior application is considered part of the disclosure of this application, and is incorporated in its entirety into this application.

TECHNICAL FIELD

The present invention relates to a circuit check device and a circuit check method.

BACKGROUND ART

Kako.co.jp, [online] "Wiring continuity checker HWC300 type/HWC200 type." discloses a technique for performing a wiring inspection (continuity check) between two separated points by the use of a master unit and a slave unit.

When a pair of electric wires is provided and connection normality of the electric wires is checked, the following procedures (1) to (4) have been conventionally performed. That is, (1) as shown in FIG. 8, a transmitter 50 that transmits a signal is connected between one end of an electric wire portion p1 of an electric wire L1 and an electric circuit different from a pair of electric wires L1 and L2 (for example, a GND 51 shown in FIG. 8) to send a test signal. (2) A receiver 52 that receives a signal is connected between the other end of the electric wire portion p1 and an electric circuit different from the pair of electric wires L1 and L2 (for example, a GND 53 shown in FIG. 8) to detect the test signal. (3) The detected test signal is analyzed, and normality of one of the pair of electric wires (the entire electric wire L1) is checked. (4) An electric wire portion p2 of the electric wire L2 undergoes (1) to (3), and normality of the other of the pair of electric wires (the entire electric wire L2) is checked.

In this way, connection normality of a pair of electric wires has been checked through two normality checks.

In FIG. 8, reference numerals T1 to T3 are connection terminals, for example, a main distributing frame (MDF).

CITATION LIST

Non-Patent Literature

Non-Patent Literature 1: "Wiring continuity checker HWC300 HWC200," [online], [searched on Jul. 3, 2018], Internet <URL: http://www.kako.co.jp/product1/hwc200>

SUMMARY OF THE INVENTION

Technical Problem

Unfortunately, the conventional connection normality check of a pair of electric wires needs to prepare an electric circuit different from the pair of electric wires (for example, a GND) and thus has been complicated. Furthermore, normality check is performed twice, which complicates the operation and requires a lot of operation time. Non-Patent Literature 1 neither discloses nor suggests any measures for these problems.

In view of such a background, the present invention has an object to simplify connection normality check of a pair of electric wires.

Means for Solving the Problem

To solve the above-described problem, the invention is a circuit check device for checking connection normality of a pair of electric wires including a first electric wire and a second electric wire, the device including, when the pair of electric wires is connected to a load device, a first voltmeter configured to measure a first inter-wire potential difference between one end of an electric wire portion of the first electric wire and one end of an electric wire portion of the second electric wire, a second voltmeter configured to measure a second inter-wire potential difference between the other end of the electric wire portion of the first electric wire and the other end of the electric wire portion of the second electric wire, and a determiner configured to determine whether the measured first inter-wire potential difference matches with the measured second inter-wire potential difference.

Furthermore, the invention is a circuit check method in a circuit check device for checking connection normality of a pair of electric wires including a first electric wire and a second electric wire, the method including, when the pair of electric wires is connected to a load device, a step of measuring a first inter-wire potential difference between one end of an electric wire portion of the first electric wire and one end of an electric wire portion of the second electric wire, a step of measuring a second inter-wire potential difference between the other end of the electric wire portion of the first electric wire and the other end of the electric wire portion of the second electric wire, and a step of determining whether the measured first inter-wire potential difference matches with the measured second inter-wire potential difference.

With the inventions, the inter-wire potential difference is used as a measurement value, and thus, unlike the conventional one, an electric circuit different from the pair of electric wires (for example, a GND) needs not be prepared. Furthermore, the inter-wire potential difference is used as a measurement value, and thus connection normality check of the pair of electric wires by the determiner only needs to be performed once.

Accordingly, connection normality check of the pair of electric wires can be simplified.

Furthermore, the invention is the circuit check device according to claim 1, in which the load device includes a direct current power supply, and the first inter-wire potential difference and the second inter-wire potential difference are direct current inter-wire potential differences.

Furthermore, the invention according to claim 2 is the circuit check device according to claim 1, in which the load device includes a direct current power supply, and the first inter-wire potential difference and the second inter-wire potential difference are direct current inter-wire potential differences.

With the invention according to claim 2, the first and second inter-wire potential differences measured by the first and second voltmeters are furthermore temporally unchanged potential differences caused by the direct current power supply to which the pair of electric wires is connected, enabling to simplify configurations of the first and second voltmeters.

Furthermore, the invention according to claim 3 is the circuit check device according to claim 1, in which the load device includes an alternating current power supply, and the first inter-wire potential difference and the second inter-wire potential difference are alternating current inter-wire potential differences.

With the invention according to claim 3, the first and second inter-wire potential differences measured by the first and second voltmeters are furthermore alternating current potential differences caused by the alternating current power supply to which the pair of electric wires is connected, enabling to avoid the possibility of malfunction of a customer terminal even when main circuit check corresponding to construction and maintenance of a subscriber circuit is performed.

Furthermore, the invention according to claim 4 is a circuit check device for checking connection normality of a pair of electric wires including a first electric wire and a second electric wire, the device including, when the pair of electric wires is not connected to a load device, a charger configured to charge the pair of electric wires, a first voltmeter configured to measure a first inter-wire potential difference between one end of an electric wire portion of the first electric wire and one end of an electric wire portion of the second electric wire, a second voltmeter configured to measure a second inter-wire potential difference between the other end of the electric wire portion of the first electric wire and the other end of the electric wire portion of the second electric wire, and a determiner configured to determine whether the measured first inter-wire potential difference matches with the measured second inter-wire potential difference.

Furthermore, the invention according to claim 8 is a circuit check method in a circuit check device for checking connection normality of a pair of electric wires including a first electric wire and a second electric wire, the method including, when the pair of electric wires is not connected to a load device, a step of charging the pair of electric wires, a step of measuring a first inter-wire potential difference between one end of an electric wire portion of the first electric wire and one end of an electric wire portion of the second electric wire, a step of measuring a second inter-wire potential difference between the other end of the electric wire portion of the first electric wire and the other end of the electric wire portion of the second electric wire, and a step of determining whether the measured first inter-wire potential difference matches with the measured second inter-wire potential difference.

With the inventions according to claims 4 and 8, the inter-wire potential difference is used as a measurement value, and thus, unlike the conventional one, an electric circuit different from the pair of electric wires (for example, a GND) needs not be prepared. Furthermore, the inter-wire potential difference is used as a measurement value, and thus connection normality check of the pair of electric wires by the determiner only needs to be performed once.

Accordingly, connection normality check of the pair of electric wires can be simplified.

Furthermore, the charger included in the circuit check device charges the pair of electric wires from the outside, enabling the pair of electric wires that is not connected to a load device to bring significant results of normality check by the use of the inter-wire potential difference.

Furthermore, the invention according to claim 5 is the circuit check device according to claim 4, in which the charger includes a direct current power supply, and the first inter-wire potential difference and the second inter-wire potential difference are direct current inter-wire potential differences.

With the invention according to claim 5, the direct current power supply of the charger included in the circuit check device charges the pair of electric wires from the outside, enabling the pair of electric wires that is not connected to a load device to bring significant results of normality check by the use of the direct current inter-wire potential difference.

Furthermore, the invention according to claim 6 is the circuit check device according to claim 4, in which the charger includes an alternating current power supply, and the first inter-wire potential difference and the second inter-wire potential difference are alternating current inter-wire potential differences.

With the invention according to claim 6, the alternating current power supply of the charger included in the circuit check device charges the pair of electric wires from the outside, enabling the pair of electric wires that is not connected to a load device to bring significant results of normality check by the use of the alternating current inter-wire potential difference.

Effects of the Invention

The present invention can simplify connection normality check of a pair of electric wires.

BRIEF DESCRIPTION OF DRAWINGS

FIG. 8 is an explanatory diagram of conventional connection normality check of a pair of electric wires.

DESCRIPTION OF EMBODIMENTS

Hereinafter, an embodiment of the present invention (hereinafter referred to as "the present embodiment") will be explained in reference to the drawings. In explaining each embodiment, redundant explanations will be omitted, and differences will be mainly explained.

First Embodiment

Figure 1:
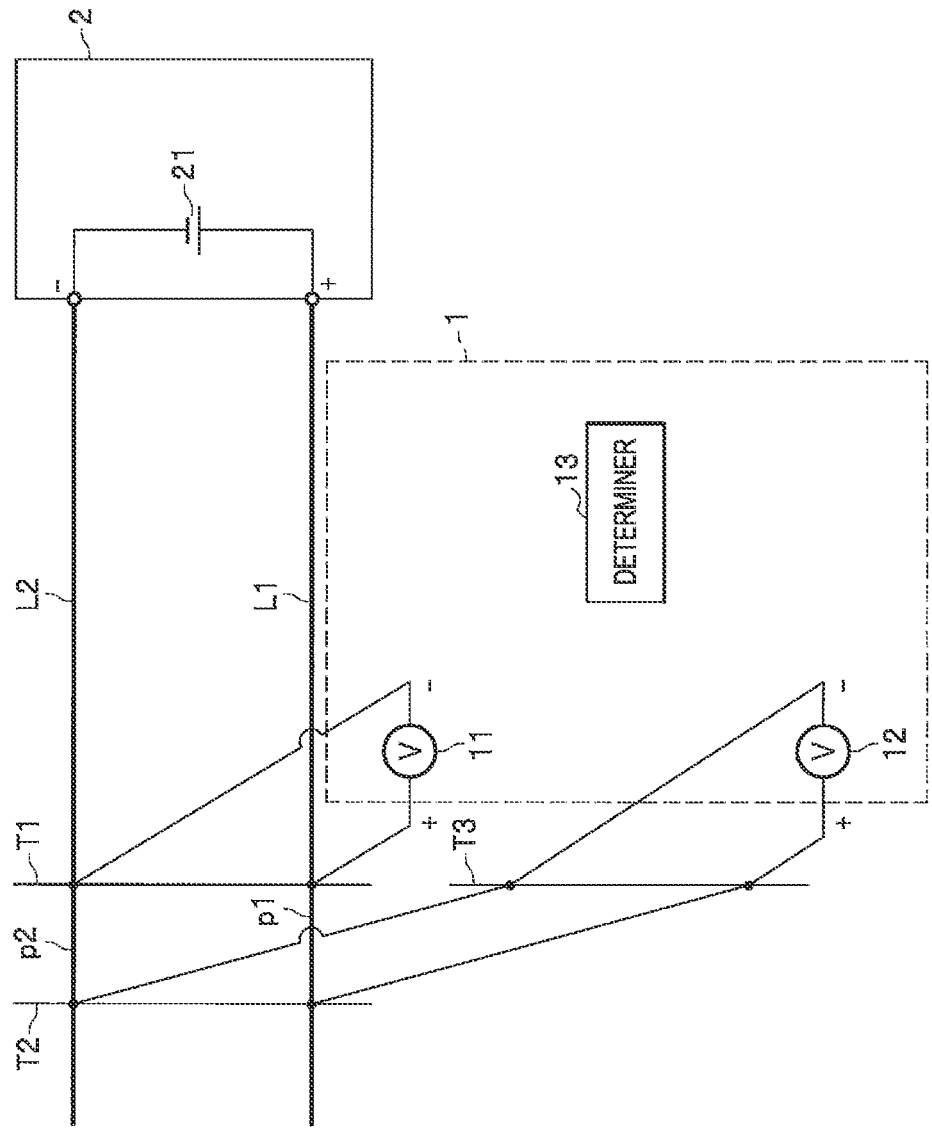
FIG. 1 is an explanatory diagram of the first embodiment.

As shown in FIG. 1, a circuit check device 1 of the first embodiment is a device that checks normality of two electric wires L1 and L2 used for an exchange 2 (a load device). The exchange 2 includes a direct current power supply 21. The electric wires L1 and L2 are connected to respective both ends of the direct current power supply 21. Furthermore, in FIG. 1, reference numerals T1 to T3 are connection terminals (represented by vertical lines), for example, a main distributing frame (MDF).

The connection terminal T1 terminates a plurality of subscriber lines (telephone lines) from the exchange 2.

The connection terminal T2 terminates a plurality of subscriber lines (telephone lines) each connected to a customer terminal (hereinafter referred to as a telephone in some cases) from a telephone station. When the subscriber line from the exchange 2 is connected to the subscriber line connected to the telephone, a maintenance person connects relevant portions of the connection terminals T1 and T2 by an electric wire (a jumper wire).

The connection terminal T3 has the same function as the connection terminals T1 and T2, and in the present embodiment, the connection terminal T3 is connected to the connection terminal T2.

The connection terminals T1 to T3 are spaced apart from each other.

One end of an electric wire portion p1 of the electric wire L1 is connected to the connection terminal T1, and the other end thereof is connected to the connection terminal T2.

One end of an electric wire portion p2 of the electric wire L2 is connected to the connection terminal T1, and the other end thereof is connected to the connection terminal T2.

The circuit check device 1 includes voltmeters 11 and 12 and a determiner 13.

The voltmeter 11 is connected to each of the one ends of the electric wire portions p1 and p2 via the connection terminal T1 and measures an inter-wire potential difference between the electric wires L1 and L2.

The voltmeter 12 is connected to each of the other ends of the electric wire portions p1 and p2 via the connection terminal T3 to be connected to the connection terminal T1 and measures an inter-wire potential difference between the electric wires L1 and L2.

The determiner 13 collates the inter-wire potential difference measured by the voltmeter 11 with the inter-wire potential difference measured by the voltmeter 12 and checks normality of the pair of electric wires L1 and L2.

The determiner 13 determines whether the direct current inter-wire potential difference measured by the voltmeter 11 matches with the direct current inter-wire potential difference measured by the voltmeter 12. When the direct current inter-wire potential difference measured by the voltmeter 11 matches with the direct current inter-wire potential difference measured by the voltmeter 12, the determiner 13 determines that the electric wires L1 and L2 are normal, and when the direct current inter-wire potential difference measured by the voltmeter 11 does not match with the direct current inter-wire potential difference measured by the voltmeter 12, the determiner 13 determines that the electric wires L1 and L2 are abnormal.

According to the first embodiment, the inter-wire potential difference is used as a measurement value, and thus, unlike the conventional one, an electric circuit different from the pair of electric wires L1 and L2 (for example, a GND [see FIG. 8]) needs not be prepared. Furthermore, the inter-wire potential difference is used as a measurement value, and thus connection normality check of the pair of electric wires L1 and L2 by the determiner 13 only needs to be performed once.

Accordingly, connection normality check of the pair of electric wires L1 and L2 can be simplified.

In particular, the inter-wire potential differences measured by the voltmeters 11 and 12 are temporally unchanged potential differences caused by the direct current power supply 21 to which the electric wires L1 and L2 are connected, enabling to simplify configurations of the voltmeters 11 and 12 (compared with a case where an alternating current power supply is used instead of the direct current power supply).

Second Embodiment

Figure 2:
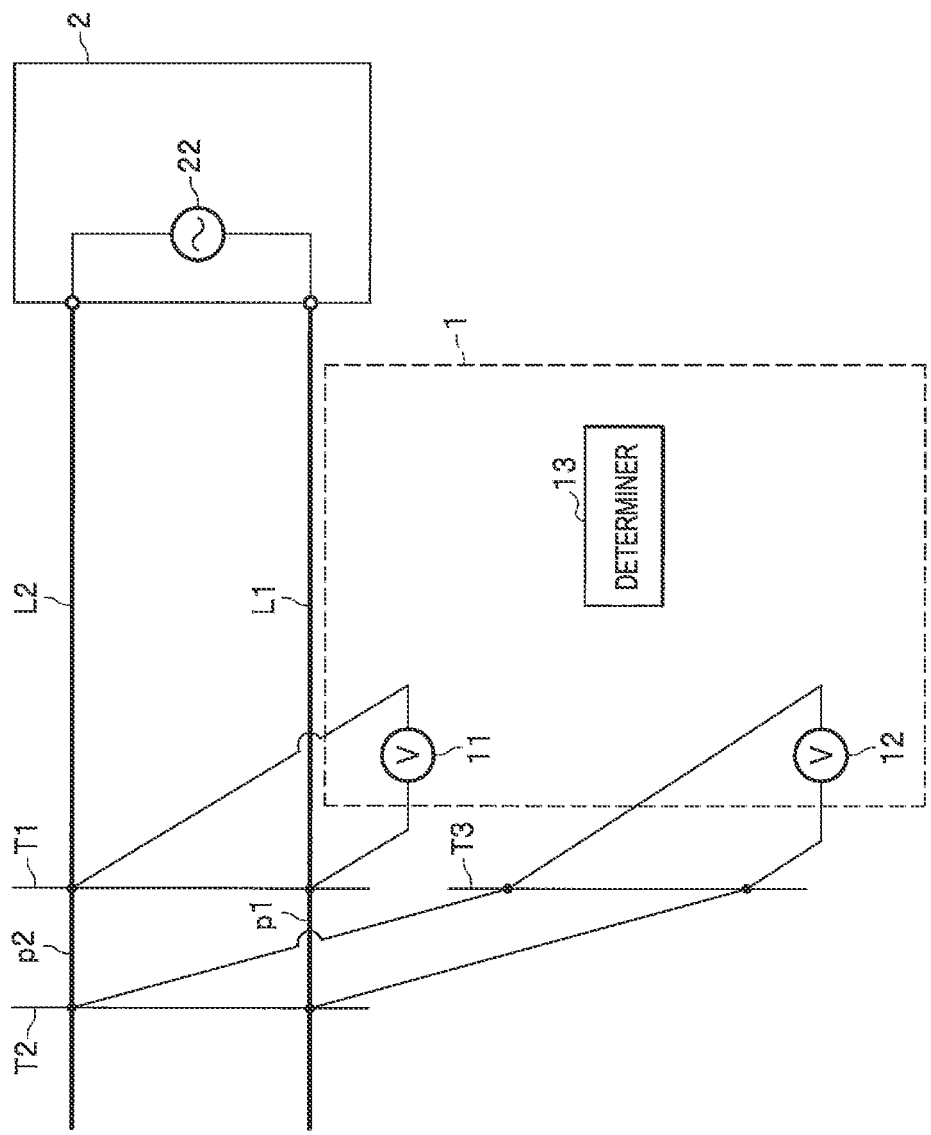
FIG. 2 is an explanatory diagram of the second embodiment.

As shown in FIG. 2, the second embodiment differs from the first embodiment in that the exchange 2 includes an alternating current power supply 22 instead of the direct current power supply 21.

The electric wires L1 and L2 are connected to respective both ends of the alternating current power supply 22. The inter-wire potential differences measured by the voltmeters 11 and 12 are thus alternating current inter-wire potential differences (instantaneous values). Accordingly, the voltmeters 11 and 12 each include a function of temporal synchronization (not shown, e.g., a clock oscillator) so as not to cause a temporal phase shift between the inter-wire potential differences measured by the voltmeters 11 and 12.

The determiner 13 determines whether the alternating current inter-wire potential difference measured by the voltmeter 11 agrees with the alternating current inter-wire potential difference measured by the voltmeter 12. When agreement occurs, the determiner 13 determines that the electric wires L1 and L2 are normal, and when no agreement occurs, the determiner 13 determines that the electric wires L1 and L2 are abnormal.

According to the second embodiment, an electric circuit different from the pair of electric wires L1 and L2 needs not be prepared, and connection normality check of the pair of electric wires L1 and L2 only needs to be performed once, enabling to simplify connection normality check of the pair of electric wires L1 and L2.

In particular, the inter-wire potential differences measured by the voltmeters 11 and 12 are alternating current potential differences caused by the alternating current power supply 22 to which the electric wires L1 and L2 are connected, enabling to avoid the possibility of malfunction of the telephone even when main circuit check corresponding to construction and maintenance of a subscriber circuit is performed.

The construction and maintenance of a subscriber circuit is stipulated that a signal having a frequency such as 1020 or 1024 Hz may be sent to a broken or empty core wire to identify a required core wire. Accordingly, using an alternating current signal that satisfies the condition of this stipulation eliminates the possibility of malfunction of the telephone. The alternating current inter-wire potential differences measured by the voltmeters 11 and 12 are preferably potential differences that satisfy the condition of this stipulation.

In the second embodiment, the pair of electric wires L1 and L2 is not connected to the telephone, and there is thus an idea that it is not necessary to dare to follow the stipulation. However, as a practical matter, when connection normality of the pair of electric wires L1 and L2 is checked, it may not be previously checked whether the customer terminal (for example, the telephone) is connected. In this case, in consideration of the possibility that the telephone is connected, the alternating current inter-wire potential difference under the condition that the telephone does not malfunction is measured, enabling smooth connection normality check of the pair of electric wires L1 and L2.

In the first embodiment, the voltmeters 11 and 12 each measure the direct current inter-wire potential difference, and thus, by deviation from the above stipulation, the telephone may malfunction. In view of this, it is useful to use the alternating current inter-wire potential difference in which the telephone does not malfunction for connection normality check of the pair of electric wires L1 and L2, as in the second embodiment. However, the first embodiment in which the direct current inter-wire potential difference is measured is advantageous in that, as already explained, configurations of the voltmeters 11 and 12 can be simplified. Thus, when it can be previously checked that the telephone is not connected to the pair of electric wires L1 and L2, the first embodiment is useful.

Third Embodiment

Figure 3:
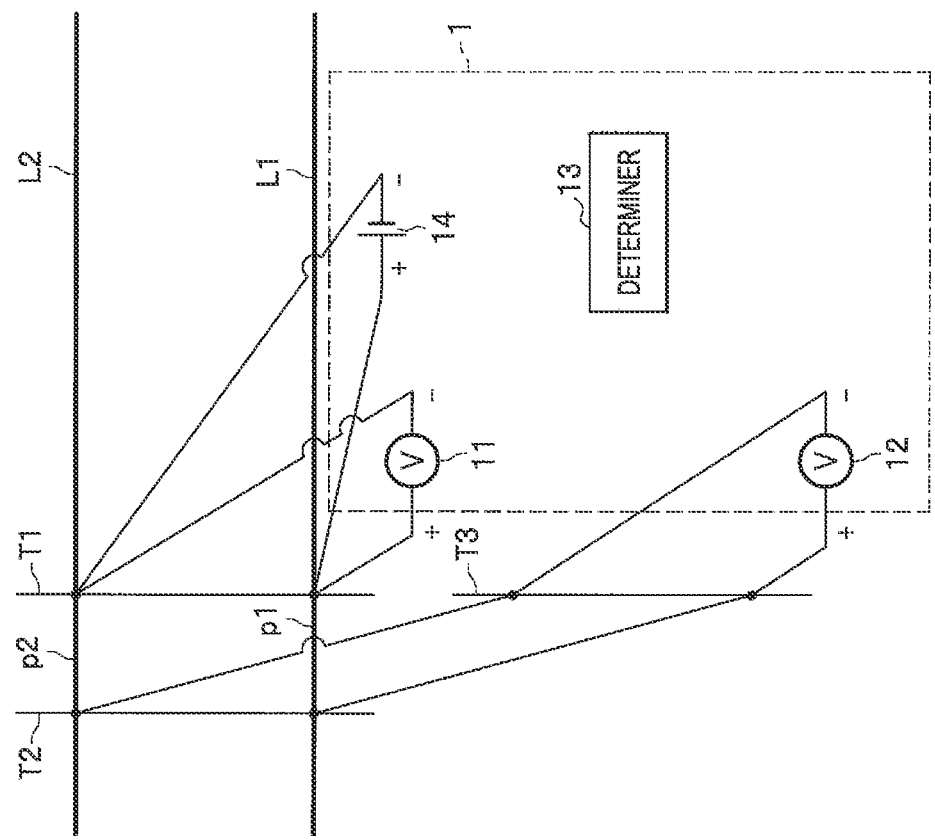
FIG. 3 is an explanatory diagram of the third embodiment.

As shown in FIG. 3, the third embodiment differs from the first and second embodiments in that the exchange 2 is not connected to the pair of electric wires L1 and L2 and that the circuit check device 1 further includes a charger 14. The charger 14 has a direct current power supply and supplies a direct current. The pair of electric wires L1 and L2 is not connected to a load device such as the exchange 2 and thus is in a state of not being charged from the outside. In this state, even if the voltmeters 11 and 12 each measure the inter-wire potential difference, no significant results can be obtained.

To avoid the above situation, the pair of electric wires L1 and L2 is charged from the outside. Specifically, the charger 14 is connected to the one ends of the electric wire portions p1 and p2 via, for example, the connection terminal T1. In the charged state, the voltmeters 11 and 12 each measure the direct current inter-wire potential difference, and the determiner 13 performs determination. These measurement and determination are the same as those in the first embodiment.

According to the third embodiment, an electric circuit different from the pair of electric wires L1 and L2 needs not be prepared, and connection normality check of the pair of electric wires L1 and L2 only needs to be performed once, enabling to simplify connection normality check of the pair of electric wires L1 and L2.

In particular, the charger 14 included in the circuit check device 1 charges the pair of electric wires L1 and L2 from the outside, enabling the electric wires L1 and L2 that are not connected to a load device to bring significant results of normality check by the use of the direct current inter-wire potential difference.

Although in FIG. 3, the charger 14 is connected to the pair of electric wires L1 and L2 at the same positions as the voltmeter 11, that is, at positions via the connection terminal T1, the connecting positions are not limited to this. The charger 14 may be connected to any positions of the pair of electric wires L1 and L2.

When the inter-wire potential difference between the one ends of the pair of electric wires L1 and L2 that are charged from the charger 14 (the one ends of the electric wire portions p1 and p2) is apparent, measurement of the inter-wire potential difference between the one ends charged from the charger 14, that is, measurement of the inter-wire potential difference by the voltmeter 11 may be omitted. According to FIG. 3, the direct current power supply as the charger 14 is directly connected to the voltmeter 11. Accordingly, when voltage and polarity of the direct current power supply are apparent, it is "when the inter-wire potential difference between the one ends of the pair of electric wires L1 and L2 that are charged from the charger 14 (the one ends of the electric wire portions p1 and p2) is apparent."

Fourth Embodiment

Figure 4:
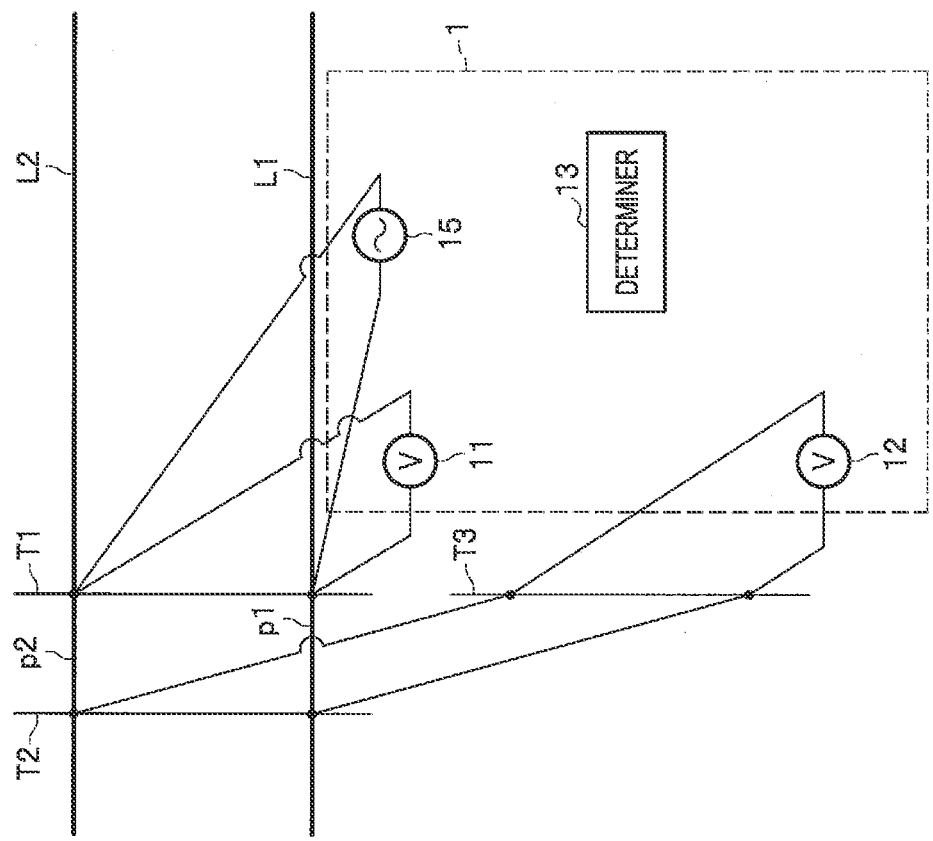
FIG. 4 is an explanatory diagram of the fourth embodiment.

As shown in FIG. 4, the fourth embodiment differs from the first to third embodiments (in particular, the third embodiment) in that the circuit check device 1 includes a charger 15. The charger 15 has an alternating current power supply and supplies an alternating current. The pair of electric wires L1 and L2 is not connected to a load device such as the exchange 2 and thus is in a state of not being charged from the outside. In this state, even if the voltmeters 11 and 12 each measure the inter-wire potential difference, no significant results can be obtained.

To avoid the above situation, the pair of electric wires L1 and L2 is charged from the outside. Specifically, the charger 15 is connected to the one ends of the electric wire portions p1 and p2 via, for example, the connection terminal T1. In the charged state, the voltmeters 11 and 12 each measure the alternating current inter-wire potential difference, and the determiner 13 performs determination. These measurement and determination are the same as those in the second embodiment.

According to the fourth embodiment, an electric circuit different from the pair of electric wires L1 and L2 needs not be prepared, and connection normality check of the pair of electric wires L1 and L2 only needs to be performed once, enabling to simplify connection normality check of the pair of electric wires L1 and L2.

In particular, the charger 15 included in the circuit check device 1 charges the pair of electric wires L1 and L2 from the outside, enabling the electric wires L1 and L2 that are not connected to a load device to bring significant results of normality check by the use of the alternating current inter-wire potential difference.

Fifth Embodiment

Figure 5:
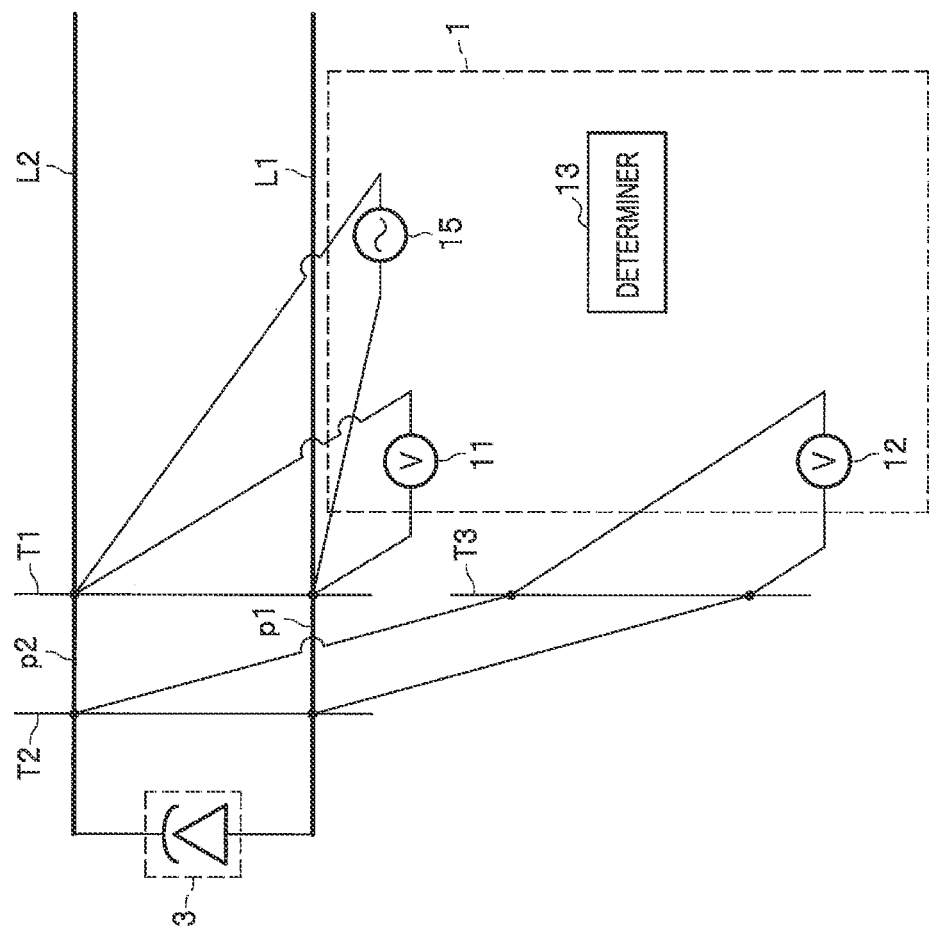
FIG. 5 is an explanatory diagram of the fifth embodiment.

As shown in FIG. 5, the fifth embodiment differs from the first to fourth embodiments (in particular, the fourth embodiment) in that a telephone 3 is connected to the pair of electric wires L1 and L2. The fifth embodiment is an embodiment of normality check when it can be previously checked that the telephone 3 that should avoid malfunction is connected to the pair of electric wires L1 and L2.

In the fifth embodiment, according to the already explained stipulation, to avoid malfunction of the telephone in normality check based on alternating current, the circuit check device 1 includes, as a charger that charges the pair of electric wires L1 and L2 from the outside, the charger 15 that is an alternating current power supply. Measurement of the alternating current inter-wire potential differences by the voltmeters 11 and 12 and determination by the determiner 13 in a state where the pair of electric wires L1 and L2 is charged by the charger 15 are the same as those in the fourth embodiment.

According to the fifth embodiment, an electric circuit different from the pair of electric wires L1 and L2 needs not be prepared, and connection normality check of the pair of electric wires L1 and L2 only needs to be performed once, enabling to simplify connection normality check of the pair of electric wires L1 and L2.

In particular, the charger 15 that is an alternating current power supply charges the pair of electric wires L1 and L2 from the outside and then connection normality of the pair of electric wires L1 and L2 is checked, enabling to reliably avoid malfunction of the telephone 3.

Sixth Embodiment

Figure 6:
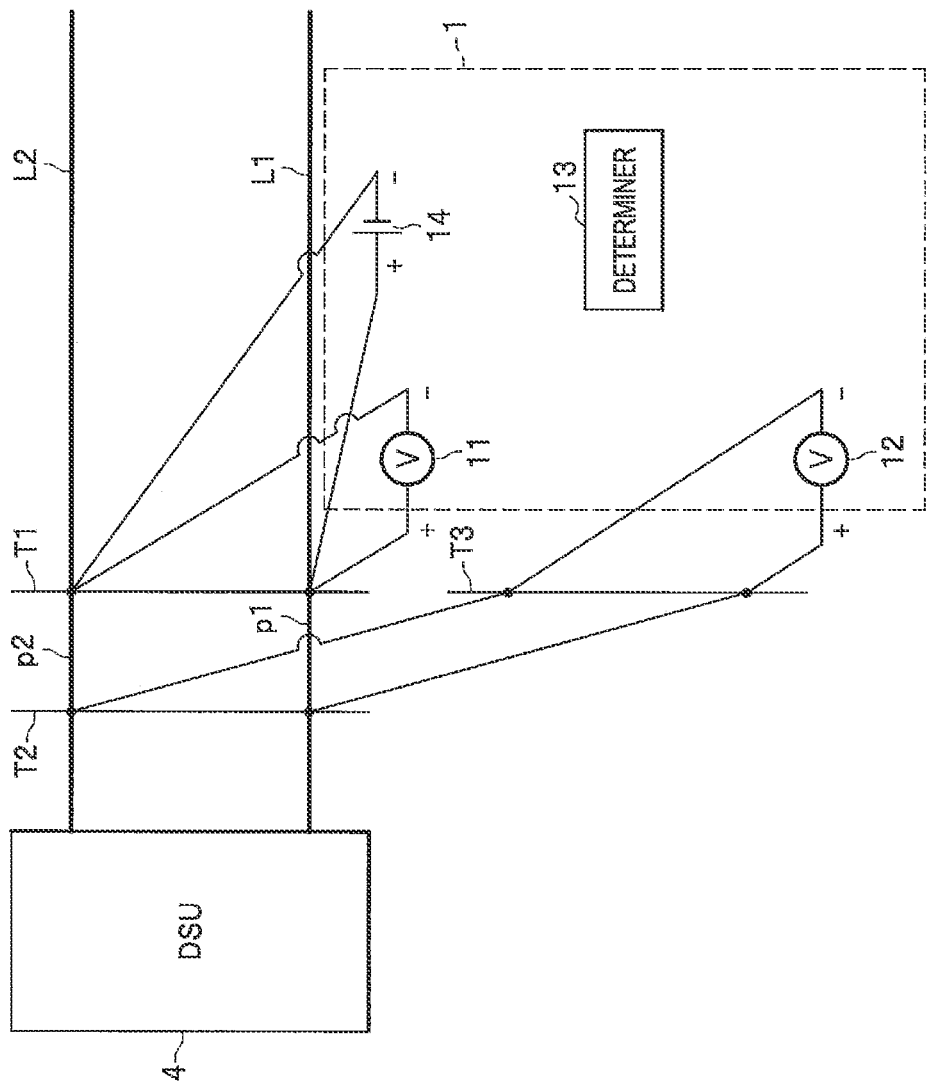
FIG. 6 is an explanatory diagram of the sixth embodiment.

As shown in FIG. 6, the sixth embodiment differs from the first and fifth embodiments (in particular, the fifth embodiment) in that a digital service unit (DSU) 4 is connected to the pair of electric wires L1 and L2 and that a charger included in the circuit check device 1 is the charger 14 as a direct current power supply.

The DSU 4 is a kind of customer terminal and, similar to the telephone 3 (FIG. 5), is a device that should avoid malfunction at the time of construction and maintenance of a subscriber circuit. Similar to the DSU 4, a device to be prepared on a customer side needs to be created so as to operate at a basic voltage of 34 to 42 V. Accordingly, when a condition of using a test signal having a sufficiently small voltage of less than 34 V is satisfied, the DSU 4 does not malfunction. The direct current inter-wire potential differences measured by the voltmeters 11 and 12 only need to be potential differences that satisfy this condition. Measurement of the direct current inter-wire potential differences by the voltmeters 11 and 12 and determination by the determiner 13 in a state where the pair of electric wires L1 and L2 is charged by the charger 14 are the same as those in the third embodiment.

According to the sixth embodiment, an electric circuit different from the pair of electric wires L1 and L2 needs not be prepared, and connection normality check of the pair of electric wires L1 and L2 only needs to be performed once, enabling to simplify connection normality check of the pair of electric wires L1 and L2.

In particular, the charger 14 that is a direct current power supply charges the pair of electric wires L1 and L2 from the outside and then connection normality of the pair of electric wires L1 and L2 is checked. Thus, the charging voltage is set to a sufficiently small voltage less than the basic voltage, enabling to reliably avoid malfunction of the DSU4.

Furthermore, the inter-wire potential differences measured by the voltmeters 11 and 12 are temporally unchanged potential differences caused by a direct current power supply as the charger 14, enabling to simplify configurations of the voltmeters 11 and 12 (compared with a case where the charger 15 as an alternating current power supply is used instead of the direct current power supply).

<Processing>

Circuit check processing in the first to sixth embodiments will be explained. The circuit check processing starts in a case where the pair of electric wires L1 and L2 is already charged, for example, the exchange 2 (FIG. 1) is connected to the pair of electric wires L1 and L2, or in a case where either one end of the pair of electric wires L1 and L2 is started to be charged from the outside by the use of the charger 14 or 15.

Figure 7:
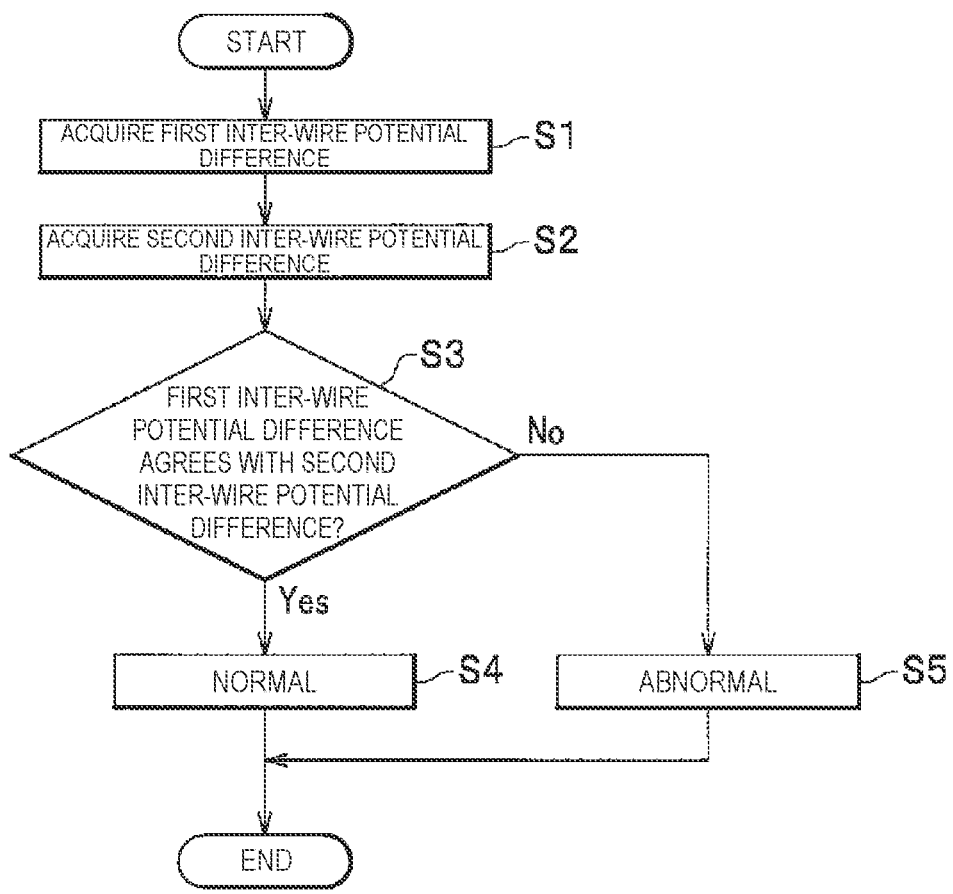
FIG. 7 is a flowchart of circuit check processing in the first to sixth embodiments.

As shown in FIG. 7, the voltmeter 11 of the circuit check device 1 first measures a first inter-wire potential difference between the pair of electric wires L1 and L2 (step S1). The first inter-wire potential difference to be measured is a direct current or alternating current potential difference. Next, the voltmeter 12 of the circuit check device 1 measures a second inter-wire potential difference between the pair of electric wires L1 and L2 (step S2). The second inter-wire potential difference to be measured is a direct current or alternating current potential difference.

Next, the determiner 13 of the circuit check device 1 determines whether the first inter-wire potential difference matches with the second inter-wire potential difference (step S3). When the match occurs (Yes in step S3), the determiner 13 determines that the pair of electric wires L1 and L2 is normal (step S4) and finishes the circuit check processing. When the match does not occur (No in step S3), the determiner 13 determines that the pair of electric wires L1 and L2 is abnormal (step S5) and finishes the circuit check processing.

(Others)

A technique using a suitable combination of various techniques explained in the embodiments can also be implemented.

REFERENCE SIGNS LIST

1 Circuit check device
11, 12 Voltmeter
13 Determiner
14, 15 Charger
2 Exchange
21 Direct current power supply
22 Alternating current power supply
T1 to T3 Connection terminal
L1, L2 Electric wire
p1, p2 Electric wire portion

The invention claimed is:

1. A circuit check device for checking connection normality of a pair of electric wires connected to a load device, the pair of electric wires comprising a first electric wire and a second electric wire, the device comprising:
a first voltmeter configured to measure a first inter-wire potential difference between a first end of an electric wire portion of the first electric wire and a first end of an electric wire portion of the second electric wire;
a second voltmeter configured to measure a second inter-wire potential difference between a second end of the electric wire portion of the first electric wire and a second end of the electric wire portion of the second electric wire;
a first connection terminal connected to the first end of the electric wire portion of the first electric wire and the first end of the electric wire portion of the second electric wire;
a second connection terminal connected to the second end of the electric wire portion of the first electric wire and the second end of the electric wire portion of the second electric wire;
a third connection terminal connected to the second connection terminal; and
a determiner, comprising a circuitry, configured to determine whether the measured first inter-wire potential difference matches with the measured second inter-wire potential difference,
wherein the first voltmeter is connected to the first end of the electric wire portion of the first electric wire and the first end of the electric wire portion of the second electric wire through the first connection terminal,
wherein the second voltmeter is connected to the second end of the electric wire portion of the first electric wire and the second end of the electric wire portion of the second electric wire through the third connection terminal, and
wherein the determiner is configured to determine that, (i) based on the first inter-wire potential difference matching the second inter-wire potential difference, connection between the first electric wire and the second electric wire is normal and, (ii) based on the first inter-wire potential difference not matching the second inter-wire potential difference, the connection between the first electric wire and the second electric wire is abnormal.

2. The circuit check device according to claim 1, wherein the load device comprises a direct current power supply, and the first inter-wire potential difference and the second inter-wire potential difference are direct current inter-wire potential differences.

3. The circuit check device according to claim 1, wherein the load device comprises an alternating current power supply, and
the first inter-wire potential difference and the second inter-wire potential difference are alternating current inter-wire potential differences.

4. A circuit check device for checking connection normality of a pair of electric wires not connected to a load device, the pair of electric wires comprising a first electric wire and a second electric wire, the device comprising:
a charger configured to charge the pair of electric wires;
a first voltmeter configured to measure a first inter-wire potential difference between a first end of an electric wire portion of the first electric wire and a first end of an electric wire portion of the second electric wire;
a second voltmeter configured to measure a second inter-wire potential difference between a second end of the electric wire portion of the first electric wire and a second end of the electric wire portion of the second electric wire;
a first connection terminal connected to the first end of the electric wire portion of the first electric wire and the first end of the electric wire portion of the second electric wire;
a second connection terminal connected to the second end of the electric wire portion of the first electric wire and the second end of the electric wire portion of the second electric wire;
a third connection terminal connected to the second connection terminal; and
a determiner, comprising a circuitry, configured to determine whether the measured first inter-wire potential difference matches with the measured second inter-wire potential difference,
wherein the first voltmeter is connected to the first end of the electric wire portion of the first electric wire and the first end of the electric wire portion of the second electric wire through the first connection terminal,
wherein the second voltmeter is connected to the second end of the electric wire portion of the first electric wire and the second end of the electric wire portion of the second electric wire through the third connection terminal, and
wherein the determiner is configured to determine that, (i) based on the first inter-wire potential difference matching the second inter-wire potential difference, connection between the first electric wire and the second electric wire is normal and, (ii) based on the first inter-wire potential difference not matching the second inter-wire potential difference, the connection between the first electric wire and the second electric wire is abnormal.

5. The circuit check device according to claim 4, wherein the charger comprises a direct current power supply, and
the first inter-wire potential difference and the second inter-wire potential difference are direct current inter-wire potential differences.

6. The circuit check device according to claim 4, wherein the charger comprises an alternating current power supply, and
the first inter-wire potential difference and the second inter-wire potential difference are alternating current inter-wire potential differences.

7. A circuit check method in a circuit check device for checking connection normality of a pair of electric wires comprising a first electric wire and a second electric wire, the method comprising:
based on the pair of electric wires being connected to a load device,
measuring, by a first voltmeter, a first inter-wire potential difference between a first end of an electric wire portion of the first electric wire and a first end of an electric wire portion of the second electric wire;
measuring, by a second voltmeter, a second inter-wire potential difference between a second end of the electric wire portion of the first electric wire and a second end of the electric wire portion of the second electric wire;
determining, by a circuitry, whether the measured first inter-wire potential difference matches with the measured second inter-wire potential difference; and
determining that, (i) based on the first inter-wire potential difference matching the second inter-wire potential difference, connection between the first electric wire and the second electric wire is normal and, (ii) based on the first inter-wire potential difference not matching the second inter-wire potential difference, the connection between the first electric wire and the second electric wire is abnormal
wherein a first connection terminal is connected to the first end of the electric wire portion of the first electric wire and the first end of the electric wire portion of the second electric wire,
wherein a second connection terminal is connected to the second end of the electric wire portion of the first electric wire and the second end of the electric wire portion of the second electric wire,
wherein a third connection terminal is connected to the second connection terminal,
wherein the first voltmeter is connected to the first end of the electric wire portion of the first electric wire and the first end of the electric wire portion of the second electric wire through the first connection terminal, and
wherein the second voltmeter is connected to the second end of the electric wire portion of the first electric wire and the second end of the electric wire portion of the second electric wire through the third connection terminal.

8. The method of claim 7, further comprising:
based on the pair of electric wires not being connected to a load device,
charging the pair of electric wires;
measuring, by a first voltmeter, a first inter-wire potential difference between a first end of an electric wire portion of the first electric wire and a second end of an electric wire portion of the second electric wire;
measuring, by second first voltmeter, a second inter-wire potential difference between a second end of the electric wire portion of the first electric wire and a second end of the electric wire portion of the second electric wire; and
determining whether the measured first inter-wire potential difference matches with the measured second inter-wire potential difference.

9. The circuit check device according to claim 1, wherein the first, second, and third connection terminals are spaced apart from each other.

10. The circuit check device according to claim 1, wherein the first connection terminal is configured to terminate a plurality of subscriber lines from the load device.

11. The circuit check device according to claim 1, wherein the second connection terminal is configured to terminate a plurality of subscriber lines each connected to a customer terminal from a base station.

12. The circuit check device according to claim 4, wherein the first, second, and third connection terminals are spaced apart from each other.

13. The circuit check device according to claim 4, wherein the first connection terminal is configured to terminate a plurality of subscriber lines from the load device.

14. The circuit check device according to claim 4, wherein the second connection terminal is configured to terminate a plurality of subscriber lines each connected to a customer terminal from a base station.

15. The method of claim 7, wherein the first, second, and third connection terminals are spaced apart from each other.

16. The method of claim 7, wherein the first connection terminal is configured to terminate a plurality of subscriber lines from the load device.

17. The method of claim 7, wherein the second connection terminal is configured to terminate a plurality of subscriber lines each connected to a customer terminal from a base station.

\* \* \* \* \*